United States Patent [19]
Leconte

[11] 4,105,928
[45] Aug. 8, 1978

[54] SEQUENTIAL CONTROL CIRCUIT CAPABLE OF SEQUENCING THROUGH A NUMBER OF STABLE STATES IN A PREDETERMINED ORDER

[75] Inventor: Gilles Leconte, Rueil-Malmaison, France

[73] Assignee: Regie Nationale des Usines Renault, France

[21] Appl. No.: 743,377

[22] Filed: Nov. 19, 1976

[30] Foreign Application Priority Data

Nov. 21, 1975 [FR] France .................. 75 35636

[51] Int. Cl.² .................. B60Q 1/08; H03K 17/28
[52] U.S. Cl. .................. 315/82; 328/75; 328/130; 315/201; 315/314
[58] Field of Search .................. 315/82, 83; 328/75, 328/130

[56] References Cited
U.S. PATENT DOCUMENTS

| | | | |
|---|---|---|---|
| 3,214,695 | 10/1965 | Betz | 328/75 X |
| 3,314,013 | 4/1967 | Dirac et al. | 328/75 X |
| 3,558,972 | 1/1971 | Hiroshi Arai | 315/83 |

*Primary Examiner*—Alfred E. Smith
*Assistant Examiner*—Charles F. Roberts
*Attorney, Agent, or Firm*—Beveridge, De Grandi, Kline & Lunsford

[57] ABSTRACT

A sequential control circuit capable of sequencing through a number of stable states in a predetermined order, starting from a predetermined stable state and sequencing in either of two opposite directions. A contact maker having two transient positions is connected to a timing circuit and to a logic circuit. In response to assumption by the contact maker of one of its transient positions, the timing circuit provides a timer signal delayed with respect to the interval of that transient position. The logic circuit sequences through a number of output conditions corresponding with the stable states in a direction determined by the particular transient position. The logic circuit includes circuitry for placing the circuit in a predetermined one of the output conditions upon initial start up.

22 Claims, 12 Drawing Figures

SEQUENTIAL CONTROL CIRCUIT CAPABLE OF SEQUENCING THROUGH A NUMBER OF STABLE STATES IN A PREDETERMINED ORDER

The present invention pertains to a device for sequential control of a number of stable states, and in particular for control of the outside lighting of an automobile. In this latter case, the different states which this lighting may adopt in succession include the state without any lighting, then switching on the side lights (or parking lights), then switching on the passing lights, and finally switching on the highway lights (headlights). In the following description the control of these different successive states in the aforesaid order between switching on the sidelights and the highway lights is called "up", and the control in the reverse direction from the state in which the highway lights are switched on until extinction of the passing lights of the vehicle is called "down".

Known devices for sequential control of a number of stable states generally utilize rotary electromechanical switches having a number of positions. Such devices are not always easy and quick to manipulate, and often they produce interference such as sparking and rebounding. In the particular case of the control of the outside lighting of an automobile, the known devices generally make use of two switches having two or more fixed positions.

In a first known device, a first switch enables three states to be obtained: no lighting, town lighting and highway lighting. A second switch, located in general near the steering wheel, is used as a lighting reverser for passing from a condition without lighting to the "sidelights" condition, or from the "sidelights" condition to the "passing lights" condition, or yet again from the "passing lights" condition to the "highway lights" condition. This latter switch may likewise enable headlights signals to be made.

In another known device, a first switch can determine two states: daytime lighting and nighttime lighting. A second, three-position switch enables the dimmed lights, the passing lights and the highway lights to be controlled.

In all these known devices the control of the passing lights, the highway lights and the parking lights is in general difficult, and employment of the devices requires, in general, a certain dexterity and hence may be dangerous to the driver or to other motorists coming toward the driver.

The object of the present invention, therefore, is to provide a device for the sequential control of a number of stable states, and in particular for the sequential control of the outside lighting of an automobile, by means of a single contact-maker, with the device not displaying the aforesaid disadvantages but enabling changing over between the different states of lighting of the vehicle to be controlled quickly and certainly, and enabling headlights signals and, if necessary, passing lights signals to be made.

The object of the present invention is likewise the provision of a timer circuit enabling a first sharp rectangular output signal to be provided from a first input signal affected by interference such as that due to rebounds of electromechanical contact-makers, this circuit providing the said first rectangular output signal only if the said first input signal has a minimum predetermined duration and providing a second consecutive rectangular output signal only if the start of a corresponding second consecutive input signal is produced a certain time after the end of the said first input signal.

In accordance with the present invention, a sequential control device of this kind is achieved by means of a contact-maker having two distinct transient positions of contact which is connected preferably via the timer circuit to a logical circuit for sequential control of different stable states, starting from a predetermined stable state, in accordance with a predetermined order in one direction or the other, the said logical circuit upon being put under voltage in its quiescent condition adopting a state corresponding with the said predetermined stable state and being automatically blocked at the end of a sequence performed in either of the two directions.

In the particular case of the control of the passing lights and highway lights of a vehicle, this logical circuit is put under voltage when a switch is switched to the "night" position. The switch ordinarily has two positions, called respectively the day position and the night position, the day position corresponding with the extinction of all the outside lighting of the vehicle and enabling only highway light signals and/or passing light signals, the night position operating the switching-on of the sidelights of the vehicle and the putting under voltage of the logical circuit which, as soon as it is put under voltage, adopts a starting state in which it operates the switching-on of the passing lights. One of the two transient positions of the contact-maker controls the "up" sequence; the second transient position of the contact-maker operates the sequence in the reverse or "down" direction. At the end of each sequence the logical circuit is blocked automatically; that is to say, it can carry out the sequence in the reverse direction only if it is controlled by the transient position which is the reverse of that which has just brought it towards end-of-sequence blocking.

In accordance with a preferred embodiment of the present invention the logical circuit is composed of an OR gate with two inputs, the first of these inputs receiving the signals emitted by the two position switch or contact-maker when it is in the first of its two positions, and the second of these inputs receiving the signals emitted by the contact-maker when it is in the second of its positions. The contact-maker produces signals of logical level 1 when it is operated. The output from the OR gate is connected to the timer circuit which produces a rectangular output signal, the leading edge of which is delayed with respect to the leading edge of the control signal from the contact-maker by preferably about 10 to 15 ms. The minimum possible duration of actuation of the contact-maker is longer than this delay, and the delay is longer than the maximum possible duration of rebounds of the contact-maker. The trailing edge of the output signal from the timer circuit is delayed with respect to the trailing edge of the same control signal by a time lying preferably between about 20 to 40 ms in order to avoid interference between two control signals too close together.

The output from the timer circuit is connected to a sequencer circuit including, in a first embodiment, a reversible counter associated preferably with a suitable decoder. In a second embodiment, the sequencer circuit includes a register having left-to-right shift. In a preferred embodiment of the invention for the particular case of the control of the lights of an automobile, which necessitates only three different stable states, the output from the delay-function circuit is connected to a circuit with two bistable flipflops. The memory input to each of these two bistable flipflops is in each case connected to the output from an AND gate. In each case, the AND gate received at one of its two inputs the transient contact signal from one of the two contact-maker transient positions, and at the other input the reversed output state from the flipflop controlled by the other AND gate, the outputs from the said bistable flipflops controlling through a logical combination circuit the means of switching the passing lights and the highway lights.

In accordance with a preferred embodiment of the invention the timer circuit includes a triggered clock which is advantageously an astable multivibrator triggered by the signals produced by the switch and producing signals of a period shorter than the minimum possible duration of the establishment of a transient contact. The astable multivibrator controls a one-shot gate, that is to say, a gate which opens only at the prescribed input signal and on condition that it is not then receiving a closing signal at its blocking input, and closes only at the arrival of a closing signal, remaining closed during the whole of the time that this closing signal is present. The timer circuit likewise includes a circuit with bistable flipflops which force the one-shot gate to remain open when it has been opened following a satisfactory order from the switch lasting at least two periods of the triggered clock.

In accordance with a preferred embodiment of the invention relative to the control of three stable states, the logical combination circuit connected to the output from the two bistable flipflops includes an AND gate with two inputs connected respectively to the reversed outputs from the two bistable flipflops. The output from the AND gate is connected to an amplifier circuit for control of the coil of a relay for switching the passing lights. This logical combination circuit includes, on the other hand, a direct tie connection between the non-reversed output from the bistable flipflop, the memory input of which is connected to the AND gate which is receiving at one of its two inputs the transient control signal for the "up" sequence, and a second amplifier circuit controlling the relay for switching the highway lights on the vehicle. Advantageously, the control of highway light signals is effected by means of another switch which, when it is closed, renders conductive the output transistor of the second amplifier for control of the highway lights.

The invention will be better understood by means of the detailed description of a number of embodiments, taken as non-restrictive examples and illustrated by the drawings attached in which:

FIG. 8 is a block diagram of a circuit which, with the circuit of FIG. 4, enables passing light signals to be made when only the sidelights are switched on;

FIG. 12 is a block diagram of a circuit which, with the circuit of FIG. 10, enables passing light signals to be made when only the sidelights are switched on.

Figure 1:
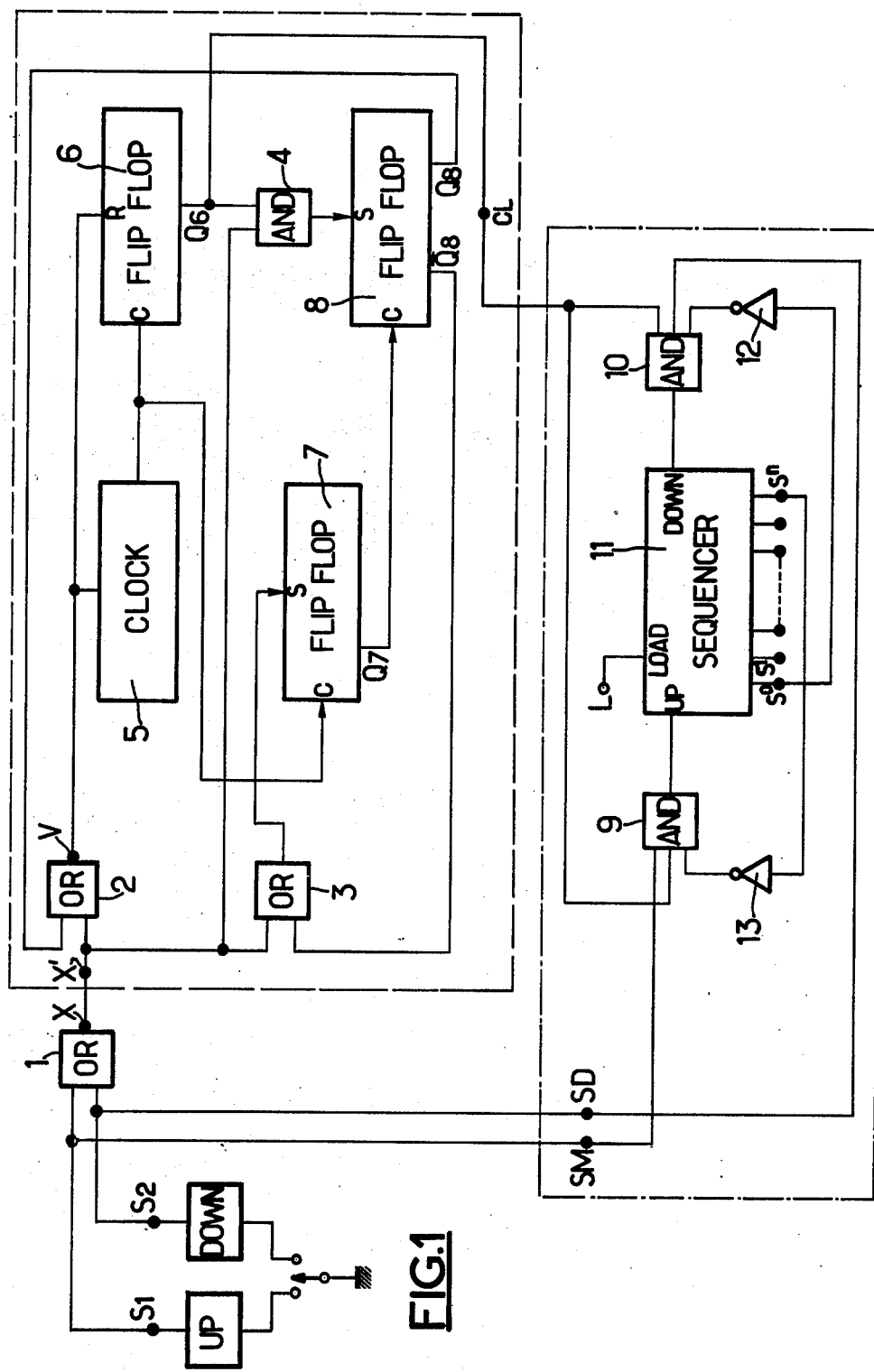
FIG. 1 is a block diagram of a sequential control circuit in accordance with the invention.

In the block diagram of FIG. 1, a switch or contact-maker $1a$ is provided, having two transient positions, up and down. Alternatively, of course, two single switches could be utilized. Each position of switch $1a$ is connected to an associated logic circuit. The up contact-maker and its logic circuit control the "up" sequence of the system and its load, while the down contact-maker and its logic circuit control the "down" sequence. The up and down contact-makers their respective logic circuits are arranged so that a logical level 1 is provided at their respective outputs $S_1$ and $S_2$ when the corresponding contacts are closed. These outputs $S_1$ and $S_2$ are connected to the two inputs to an OR gate 1 as well as to a terminal SM and a terminal SD respectively. The output X from OR gate 1 is connected to a terminal X' which in turn is connected to one of the inputs to an OR gate 2. The terminal X' is also connected to one of the inputs to a third OR gate 3, and finally to one of the inputs to an AND gate 4. The output V from OR gate 2 is connected, on the one hand, to the input to a triggered clock 5, which may advantageously be a gated astable multivibrator, and, on the other hand, to the initial or zero state reset input to a bistable flipflop circuit 6 operating as a one-shot gate. The output from triggered clock 5 is applied to the clock input of flipflop 6.

The direct output $Q_6$ from flipflop circuit 6 is connected, on the one hand, to the second input to AND gate 4 and, on the other hand, to a terminal CL. The output from the triggered clock 5 is likewise connected to apply the clock signals to the clock input of a flipflop 7 mounted as a divider by 2. The positioning or set to 1 input of flipflop 7 is connected to the output from OR gate 3, and the direct output $Q_7$ from flipflop 7 is connected to the clock input to another flipflop 8. The positioning or set to 1 input to flipflop 8 is directly connected to the output from AND gate 4.

The direct output $Q_8$ from the flipflop 8 is connected to the second input to OR gate 2, and the reversed output $\overline{Q}_8$ from flipflop 8 is connected to the second input to OR gate 3. The circuit including elements 2 to 8, the input to which is the terminal X' and the output from which is the terminal CL, constitutes a timer circuit the operation of which is explained hereinafter.

The terminal SM is connected to one input to an AND gate 9, while the terminal SD is connected to one input to another AND gate 10. The terminal CL is connected to a second input to each of the gates 9 and 10. The output from AND gate 9 is connected to the forward counting or up input to a sequencer circuit 11, while the output from AND gate 10 is connected to the backwards counting or down input to the circuit 11. Sequencer circuit 11 includes $n$ outputs, referenced $S^0$ to $S^n$. When a loading order (for example, a pulse of logical level 1) is applied to the loading terminal L of circuit 11, the logical level 1 is made to appear at one of the outputs $S^o$ to $S^n$, all the other outputs being then at the logical level 0 (or vice versa).

The first output $S^o$ from sequencer circuit 11 is connected via inverter 12 to the third input to AND gate 10, while the last output $S^n$ from sequencer circuit 11 is connected via inverter 13 to the third input to AND gate 9.

The circuit 11 is designed so that at most, only one of its outputs can be excited or at the logical level 1, and for the "up" sequence the outputs are excited one after another in the direction going from $S^o$ to $S^n$, while for the "down" sequence the outputs are excited in the reverse direction. The "up" sequence is controlled by AND gate 9, the three inputs to which must simultaneously receive signals of logical level 1, in order to provide an output, while the "down" sequence is controlled by AND gate 10, the three inputs to which likewise must receive simultaneously signals of logical level 1 in order to provide an output.

Because the outputs $S^o$ and $S^n$ from the circuit 11 are connected in each case via an inverter to one input to the AND gates 10 and 9 respectively, there is blocking at the end of a sequence, that is to say, for example, if the level 1 appears at the gate $S^o$ following a transient closing of the down contact-maker, another consecutive transient closing of the down contact-maker will not cause the state of the outputs from the circuit 11 to change and it will then be necessary to close the up contact-maker in order to cause the next change of state.

Figure 2:
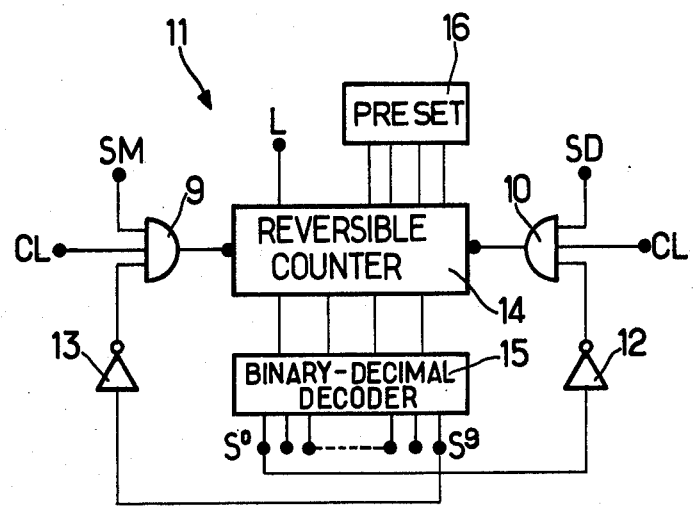
FIG. 2 is a block diagram of an embodiment of a portion of the circuit of FIG. 1.

FIG. 2 is a logical block diagram of an embodiment of a circuit suitable for use as the sequencer circuit 11. This sequencer circuit includes a reversible binary counter 14 connected to a binary-decimal decoder 15 having ten outputs $S^o$ to $S^9$. The output $S^o$ is connected to the inverter 12, while the output $S^9$ is connected to the inverter 13. The gates 9 and 10 are connected in the same way as in FIG. 1.

The reversible counter 14 is likewise connected in known manner to a coder device 16, for example, a coder wheel enabling the excitation of one of the outputs $S^o$ to $S^9$ to be selected when a signal is sent to the loading terminal of the counter, thus defining a stable starting state from which the "up" and "down" sequences develop. The operation of such a reversible counter device is well known and will not be explained below. It will be observed simply that the forward counting pulses proceed from AND gate 9 and those for backward counting from AND gate 10.

Figure 3:
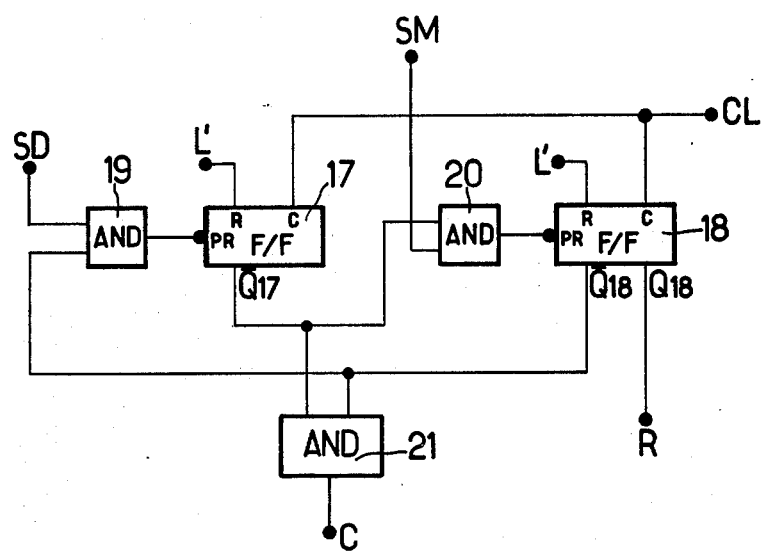
FIG. 3 is a block diagram of a variant upon the circuit of FIG. 2.

FIG. 3 is the diagram of a simplified variant upon the circuit as FIG. 2, which enables only three stable states to be controlled and is applicable in particular to the control of the outside lighting of a vehicle. The terminal CL is connected to the clock input to each of two bistable flipflops 17 and 18, with toggle being produced in response to the leading edge of the clock signal. The preset input to the flipflop 17 is connected to the output from an AND gate 19, while the preset input to the flipflop 18 is connected to the output from an AND gate 20. AND gate 19 has its first input connected to the terminal SD from down contact-maker and its second input connected to the reversed output $\overline{Q}_{18}$ from flipflop 18. AND gate 20 has its first input connected to the reversed output $\overline{Q}_{17}$ from the flipflop 17 and its second input connected to the terminal SM from up contact-maker.

Figure 5:
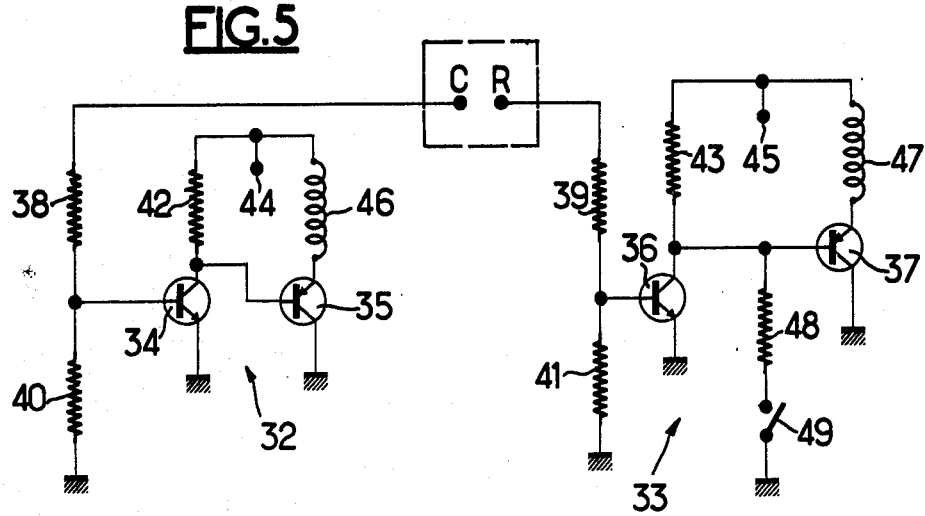
FIG. 5 is a schematic diagram of an amplifier circuit for control of the outside lighting of a vehicle and which may be connected to the circuit of FIG. 4.

The reversed output $\overline{Q}_{17}$ from flipflop 17 and the reversed output $\overline{Q}_{18}$ from flipflop 18 are connected to the two inputs to an AND gate 21, the output from which is connected to an output terminal C. The direct output $Q_{18}$ from the flipflop 18 is connected directly to an output terminal R. The terminals C and R are connected respectively, as seen in FIG. 5, to the inputs to amplifiers for control of the relays for switching the passing lights and the highway lights of a vehicle equipped with this sequential control. These amplifiers control switching relays to ensure switching-on of the corresponding lights of the vehicle when the relays receive at their inputs logical levels 1.

Each of the flipflops 17 and 18 has a reset input L' to place the flipflop in its initial or zero state upon putting the circuit under voltage in its quiescent condition.

In the quiescent condition of the circuit of FIG. 3, flipflops 17 and 18 are reset, as has just been said above, and the zero state is provided at the outputs $Q_{17}$ and $Q_{18}$. The output $Q_{17}$ is unused, while the output $Q_{18}$ is connected directly to the output terminal R which controls the switching-on of the highway lights of the vehicle. Consequently, in this quiescent condition, there is displayed at the output terminal R, the logical level 0, and the highway lights of the vehicle are not switched on.

Also in the quiescent condition, there is provided at the terminals SM and SD logical levels 0, and these are applied to inputs to the AND gates 20 and 19, respectively. Hence, there is at the output from AND gates 19 and 20 the logical level 0 which is applied to the memory inputs to the flipflops 17 and 18 respectively.

On the other hand, the inputs to the AND gate 21 are both at the logical level 1 because they are directly connected to the outputs $\overline{Q}_{17}$ and $\overline{Q}_{18}$ from the flipflops 17 and 18. Consequently, a logical level 1 is applied by the output from AND gate 21 to output terminal C, which controls the switching-on of the passing lights of the vehicle, as specified above.

Assume that the up contact-maker is closed for a brief moment. This closing of the up contact-maker sends a signal of level 1 through OR gate 1 to the timer device, the operation of which will be explained below with reference to FIG. 6. This signal, with delayed leading edge and trailing edge, then reaches the clock signal inputs to flipflops 17 and 18 via the terminal CL. At the instant of closing of the up contact-maker there is no change in the logical states present at the inputs to the gate 19, and so the output from this gate is still the logical level 0, and hence, flipflop 17 does not change state at the clock signal input.

On the other hand, closing of the up contact-maker causes the appearance of a signal of logical level 1 at the terminal SM, with the effect that the output from gate 20 is the logical level 1. As the signal at the output from gate 20 has changed in value, flipflop 18 is enabled to change state at the rising edge of the signal arriving at its clock input, and there is then the logical level 1 at its output $Q_{18}$ and the logical level 0 at its output $\overline{Q}_{18}$.

Because there is the logical level 0 at the output $\overline{Q}_{18}$ from the flipflop 18 and this output $\overline{Q}_{18}$ is connected to one of the inputs to the AND gate 21, there is then provided at the terminal C the logical level 0, and there is extinction of the passing lights. On the other hand, inasmuch as there is the signal of level 1 at the output $Q_{18}$ which is connected directly to the terminal R, there is immediately switching-on of the highway lights of the vehicle.

If the up contact-maker is then reclosed a second time, there will still be a signal of logical level 1 at the output from the gate 20, and the flipflop 18 will not change state. Moreover, inasmuch as there will still be the level 0 at the output from the gate 19, the flipflop 17 will not change state either. Consequently, the end-of-"up"-sequence locking mentioned above, it obtained.

On the other hand, if the highway lights are switched on and if the down contact-maker is closed, there is still a level 0 at the output from the gate 19, but there is a level 0 at the output from the gate 20, whereas previously it was at the level 1, and consequently the flipflop 18 changes state, that is to say, the output $Q_{18}$ becomes logical level 0, bringing about extinction of the highway lights, and the output $\overline{Q}_{18}$ becomes logical level 1 and is applied to one input to AND gate 21, the other input to which, being connected to the output $\overline{Q}_{17}$, is still at the level 1. Consequently, there is the level 1 at the output C again and there is switching-on of the passing lights of the vehicle. The logical circuit has therefore returned to its starting state, that is to say, the state that is obtained upon putting the logical circuit of this FIG. 3 under voltage in its quiescent condition. By similar reasoning it may very easily be demonstrated that starting from this starting state, closing the down contact-maker causes extinction of the passing lights, the highway lights still being out, and a second successive closing of the down contact-maker does not cause any change in the states of the logical circuit of FIG. 3 (end-of-"down"-sequence locking), but that starting from the starting state and closing down contact-maker and then closing up contact-maker brings the logical circuit back into the starting position.

Figure 4:
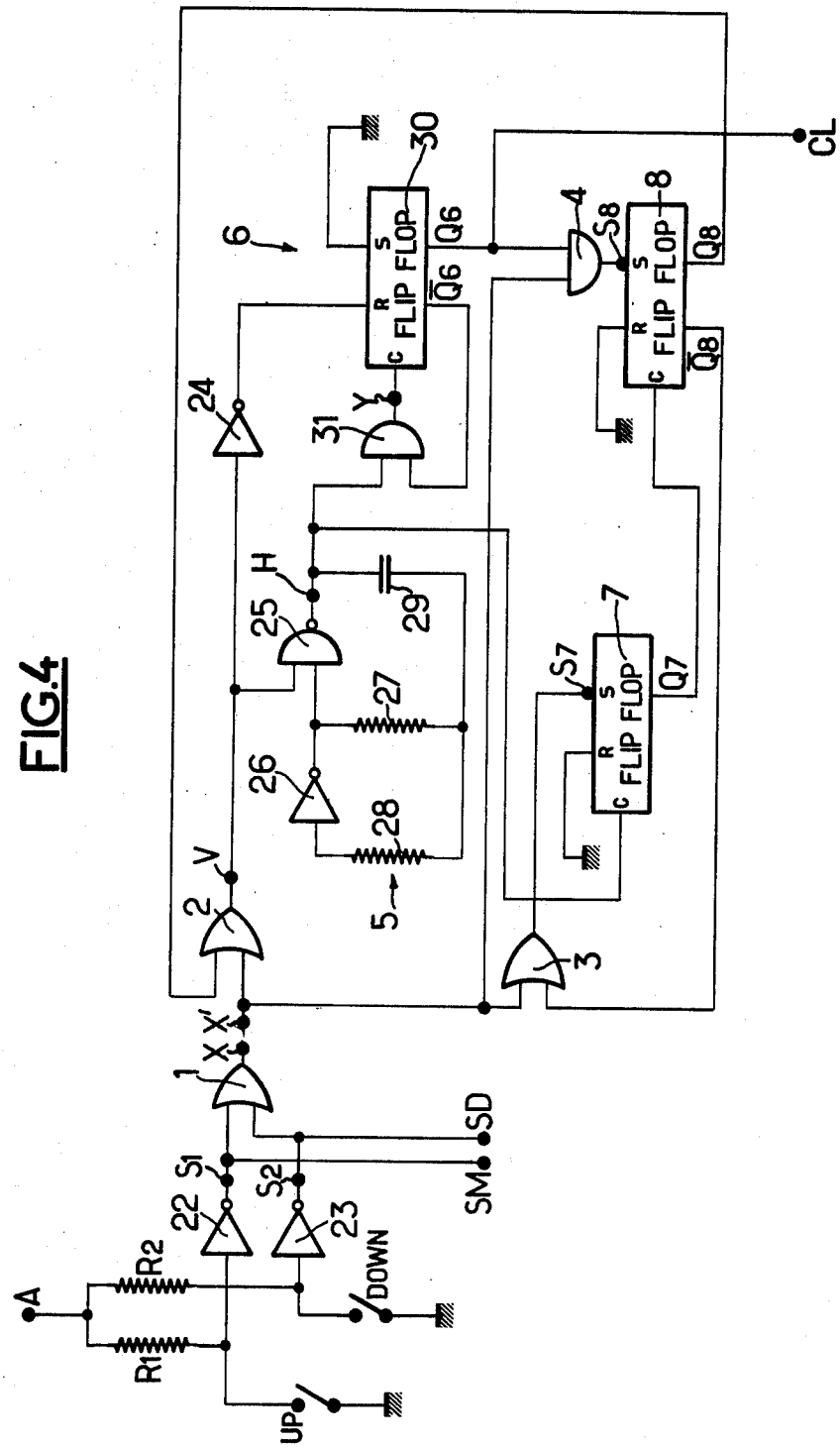
FIG. 4 is a block schematic diagram of an embodiment in accordance with the invention of a circuit for sequential control of the outside lighting of a vehicle.

FIG. 4 represents an embodiment of sequential control circuit of FIG. 1 in accordance with the invention. In FIG. 4, the elements identical with those of FIG. 1 are designated by the same reference characters. The up and down switches have their moving contacts directly connected to ground and their fixed contacts connected via resistors $R_1$ and $R_2$, respectively, to a terminal A to which is applied a positive voltage to cause to appear at the fixed contacts the logical level 1 when the up and down switches are open. The fixed contacts of the up and down switches are connected to the inputs to two inverters 22 and 23 respectively, the outputs from which are respectively connected to the terminals $S_1$ and $S_2$. The up switch resistor $R_1$ and its connection to terminal A are equivalent to the up switch and its contact-maker of FIG. 1 described above. Similarly, the down switch, resistor $R_2$ and its connection to terminal A are equivalent to the down switch and its contact-maker of FIG. 1. The terminals $S_1$ and $S_2$ are respectively connected to the terminals SM and SD as well as to the inputs to OR gate 1.

The output V from OR gate 2 is connected, on the one hand, to the input to an inverter 24 and, on the other hand, to one input to a NAND gate 25. The second input to NAND gate 25 is connected to the output of another inverter 26 as well as to one end of a resistor 27, the other end of which is connected to the first end of another resistor 28 as well as to one electrode of a capacitor 29. The other end of the resistor 28 is connected to the input to inverter 26, while the other electrode of capacitor 29 is connected to the output H from NAND gate 25.

Elements 25 to 29 form triggered clock 5 which functions in a manner in itself known; thus, when the input to NAND gate 25 that is connected to the output V from OR gate 2 is brought to the logical level 1, the clock produces rectangular signals at the output H from gate 25.

The output from inverter 24 is connected to the initial or zero state reset input to a bistable flipflop 30, the positioning or set at 1 input to which is directly connected to ground. The output H from NAND gate 25 is connected to a first input to an AND-gate 31, the output from which is connected to the clock signals input Y to the bistable flipflop 30. The reversed output $\overline{Q}_6$ from flipflop 30 is connected to the second input to AND gate 31, while the direct output $\overline{Q}_6$ from flipflop 30 is connected to the terminal CL as well as to one of the inputs to AND gate 4. The whole of the elements 24 to 31 forms the one-shot gate 6 of FIG. 1. The flipflops 7 and 8 are connected in the same way as in FIG. 1, and it will be observed simply that the initial or zero state reset inputs are connected to ground.

FIG. 5 is the detail diagram of a preferred embodiment of control amplifiers 32 and 33 which are connected to the output terminals C and R, respectively, of the circuit of FIG. 3 for control of relays enabling, respectively, the passing lights and highway lights or headlights of an automobile to be controlled. The amplifiers 32 and 33 are identical. In amplifier 32, NPN transistor 34 has its emitter tied to ground, its base coupled to terminal C through resistor 38 and coupled to ground through resistor 40, and its collector coupled by resistor 42 to terminal 44. PNP transistor 35 has its collector tied to ground, its base tied to the collector of transistor 34 and its emitter coupled to terminal 44 through excitation winding 46 of the relay (not shown) for switching the passing lights. Likewise, in amplifier 33, NPN transistor 36 has its emitter tied to ground, its base coupled to terminal R through resistor 39 and coupled to ground through resistor 41, and its collector coupled to terminal 45 through resistor 43. PNP transistor 37 has its collector tied to ground, its base tied to the collector of transistor 36 and its emitter coupled to terminal 45 through excitation winding 47 of the relay (not shown) for switching the highway lights.

Transistors 34 and 36 are low-power amplifier transistors, while transistors 35 and 37 are transistors of a power designed to control the relays for switching the passing lights and highway lights. The preamplifier transistors 34 and 36 are of NPN type, while the transistors 35 and 37 are of PNP type, which enables direct connection to be effected between the preamplifier transistors and the power amplifier transistors without employment of recovery diodes.

As will be seen later in relation to FIG. 7, the feed voltage for amplifier circuits 32 and 33 is applied to terminals 44 and 45, but these terminals are not tied together. This feed voltage is generally different from the feed voltage for the logical circuit described above.

The base of the transistor 27 is connected to ground via a suitable resistor 48 and a normally-open transient-closing switch 49. This series circuit composed of resistor 48 and switch 49 enables connection of the base of transistor 37 to ground when switch 49 is closed, and the transistor then becomes conductive so that a current flows through the excitation coil 47 for the highway lights of the vehicle which are thus switched on. Hence, the highway lights can be energized as soon as there is a voltage at terminal 45, even if the logical circuit of FIG. 3 is not fed with voltage. It is equally obvious that the same type series circuit might be connected to the base of transistor 35 for energizing the passing lights, but this is in general not necessary, and so such a circuit for transistor 35 is not shown in FIG. 5.

The components of the amplifier circuits 32 and 33 have been chosen so that when the logical level 0 appears at the terminal C and R, the transistors 35 and 37 are cut off, that is to say, the relays for switching the passing lights and the highway lights are not excited. Likewise, when the logical level 1 appears at the terminals C and R, the transistors 35 and 37 are rendered conductive, which excites the corresponding switching relays and causes switching-on of the passing lights or highway lights.

Figure 6:
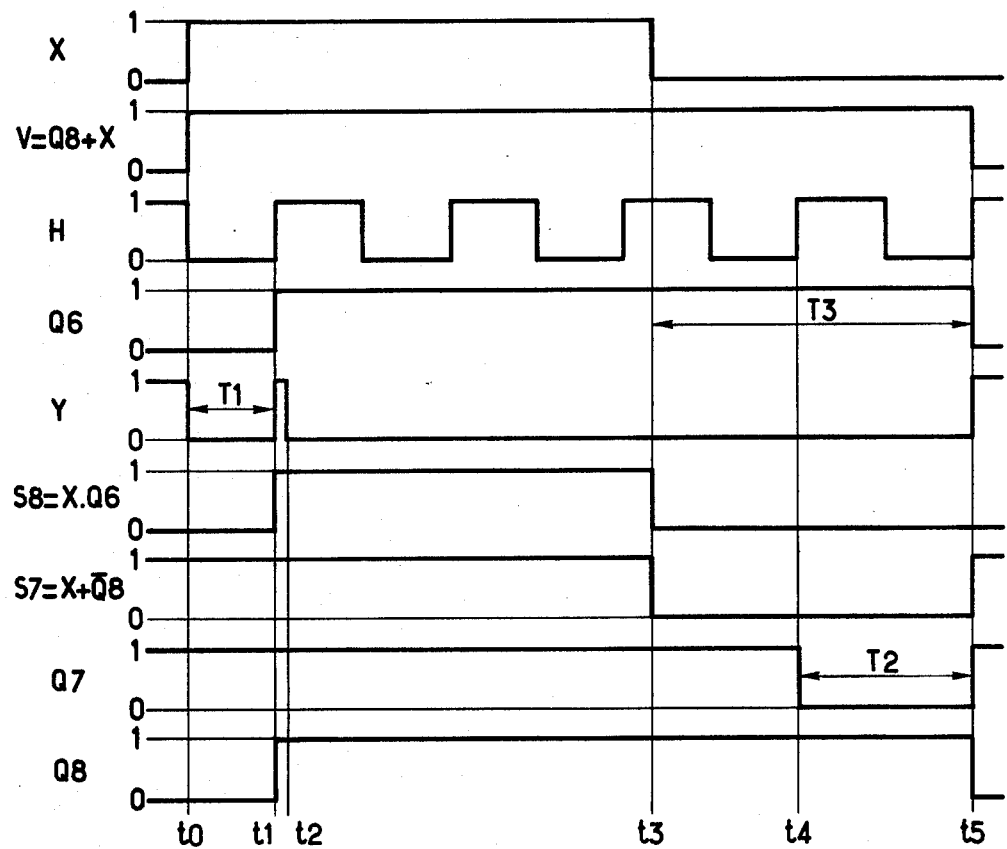
FIG. 6 is a graph, as a function of time, of some signals appearing in the circuit of FIG. 4.

There will now be explained by means of the graph of FIG. 6, the operation of the timer circuit of FIG. 4. In this FIG. 6 is shown from top to bottom the development with time of the following signals:

X: signal which appears at output X from gate 1 when one of the up and down transient contacts is closed momentarily. It is likewise the signal which appears at the terminal SM or SD respectively;

V: signal which appears at the output V from gate 2;

H: signal which appears at output H from triggered clock 5;

$Q_6$: signal which appears at the output $Q_6$ from the flipflop 30 of the one-shot gate 6, as well as at the terminal CL and acts as the clock signal for the sequencer circuit of the present invention such, for example, as that shown in FIG. 2 or FIG. 3;

Y: signal which appears at input Y to flipflop 30;

$S_8$: signal which appears at the output from AND gate 4 and acts as positioning signal (set to 1) for flipflop 8;

$S_7$: signal which appears at the output from OR gate 3 and acts as positioning signal (set to 1) for flipflop 7;

$Q_7$: signal which appears at the direct output $Q_7$ from flipflop 7;

$Q_8$: signal which appears at the direct output $Q_8$ from flipflop 8.

When the circuit of FIG. 4 is in its quiescent condition, there is at the terminals $S_1$ and $S_2$ the logical level 0, as explained above. Consequently, at the output X from OR gate 1, there is likewise the level 0, which causes AND gate 4, one of the inputs to which is connected to the terminal X, to be blocked, and there is at the gate 4 output the level 0. Flipflop 8 is thus set at 0, and there is the level 0 at the output $Q_8$.

The input to NAND gate 25, which is connected to the output V from OR gate 2, thus receives the logical level 0, and hence, gate 25 is blocked and its output H is the logical level 1. The output from inverter 24 is the logical level 1, and flipflop 30 is set at 0 with its output $Q_6$ brought to 0.

The inputs to AND gate 31 receive a logical level 1 from the output H of clock 5 and from the output $\overline{Q_6}$ from flipflop 30, and therefore the output from gate 31 applies a logical level 1 to input Y of flipflop 30.

Finally, in the quiescent condition, the output $Q_8$ of flipflop 8 being at 0 is explained above, its reverse output $\overline{Q_8}$ is at 1, and so a logical level 1 is provided by the output of OR gate 3 to flipflop 7. Therefore, at the output $Q_7$ from flipflop 7, there is the logical level 1.

These different states which are displayed at various points in the circuit of FIG. 4 in the quiescent condition, are shown to the left of the time $t_o$ in FIG. 6.

Assume that a time $t_o$ the up contact-maker is closed momentarily. At this instant the logical level at the terminal X changes to 1, according to what has been said about the operation of the up and down contact-makers. The logical level at the terminal V, therefore, likewise changes to 1. On the other hand, because before time $t_o$ the output H from NAND gate 25 was the logical level 1, capacitor 29 was charged, and consequently the logical level 1 is applied to the input to gate 25 by inverter 26. Hence, at time $t_o$ the two inputs to gate 25 are brought to 1, and so output H becomes logical level 0 and clock 5 begins to oscillate at a frequency determined primarily by capacitor 29. Clock 5 continues to oscillate so long as the logical level 1 is present at the output V from gate 2. Because at time $t_o$ the logical level at V changes to 1, the logical level at the output from inverter 24 changes to 0, and flipflop 30 is unblocked and is able to toggle as soon as there is a rising front at its clock input Y.

On the other hand, because at time $t_o$ the level at H changes over to 0, it likewise changes over to 0 at Y; that is to say, at the output from AND gate 31. Hence, at the instant $t_o$, no rising front is produced at Y and so flipflop 30 remains at 0; that is to say, there is still the level 0 at its output $Q_6$ and the level 1 at its output $\overline{Q_6}$.

Because at time $t_o$ there is still 0 at $Q_6$, there is likewise the level 0 at the output from the gate 4, and flipflop 8 is still positioned at 0. Accordingly, there is still the level 0 at its output $\overline{Q_8}$ and the level 1 at its output $Q_8$, and flipflop 7 is still being positioned at 1, that is to say, there is still the logical level 1 at its output $Q_7$.

Assume that the first rising front of the signal from the triggered clock 5 is produced at time $t_1$, the up contact still remaining closed because, as specified above, the triggered clock 5 is selected so that the period of its signal is shorter than the duration of the closing of the up and down contact-makers.

At time $t_1$, with the level at H changing back to 1, the gate 31 goes to 1, and a rising front appears at Y, which makes the flipflop 30 toggle. Output $Q_6$ thus changes to 1 and output $\overline{Q_6}$ changes to 0 at time $t_2$, which occurs almost immediately after time $t_1$. The interval of time $t_1$-$t_2$ that is necessary to obtain toggling of the flipflop 30 has been exaggerated on the graph in FIG. 6.

As soon as flipflop 30 has toggled, the level 0 appears at its output $\overline{Q_6}$, which blocks gate 31, and so the signal Y changes back to the level 0 at time $t_2$.

The toggling of flipflop 30 causes a logical level 1 from AND gate 4, and hence flipflop 8 is set to 1, that is to say, the level 1 appears at the output $Q_8$ from the flipflop 8.

At time $t_2$ flipflop 7 is still receiving from gate 3 the level 1 transmitted by the output X of gate 1, and flipflop 7 therefore does not change state.

Assume that the up contact-maker has reopened at time $t_3$ which occurs after a certain number of periods of the signal at the output H from the triggered clock 5. Between the times $t_2$ and $t_3$, only the level at the point H changes.

At time $t_3$, the level at X changes to 0, which has the consequence that the level at the output from the gate 3 changes to 0. Flipflop 7 is no longer held in its logical state 1, and hence flipflop 7 is able to toggle as soon as a rising front appears at its clock signal input. Similarly at time $t_3$ the level 0 appearing at X blocks gate 4, and so flipflop 8 is no longer being forced to 1, but likewise is able to toggle at the first rising front which appears at its clock signal input.

Assume that after time $t_3$ the first rising front appearing at H occurs at the time $t_4$. At time $t_4$, flipflop 7, therefore, changes state, and the level at $Q_7$ changes to 0.

If neither of the two up or down contact-makers is reclosed, level 0 continues at X, and, flipflop 8 still not having changed state, level 0 continues at the output from gate 3; that is to say, flipflop 7 is not forced to 1 and changes state only upon the arrival of the next rising front which appears at its clock signal input. On the other hand, because flipflop 8 has not changed state, there is still the level 1 at its output $Q_8$; hence, likewise, the level 1 continues at output V from gate 2, and the triggered clock 5 continues to oscillate.

Let $t_5$ be the time one period of the signal from clock 5 after time $t_4$. At this time $t_5$, therefore, there occurs another rising front of the signal at H which again makes the flipflop 7 toggle; that is to say; at time $t_5$ a rising front occurs at the output $Q_7$ from flipflop 7, and this rising front therefore makes the flipflop 8 toggle, and so the output $Q_8$ changes back to 0.

Because, as has just been said, the level at X remains at 0 between time $t_3$ and time $t_5$ and the level at $Q_8$ has just changed back to 0, there is the level 0 at V, which blocks the clock 5, the output level from which remains 1 at H. Because there is a level 0 at V, there is the level 1 at the output from inverter 24, and flipflop 30 is reset to 0; that is to say, the level at $Q_6$ changes to 0 and the level at $\overline{Q}_6$ changes to 1. Hence, the level at Y changes to 1, but flipflop 30 can no longer change state because it is forced to 0 by the signal appearing at the output from inverter 24. At time $t_5$, no change of level occurs at $S_8$, which has remained at 0 since time $t_3$, the time at which the level at X changed to 0. After time $t_5$ the level at $S_7$ remains at 1 because flipflop 8 can no longer change state; that is to say, the level at $\overline{Q}_8$ remains at 1. After time $t_5$ the level at $S_7$ remains at 1, and flipflop 7 remains at 1 with $Q_7$ at level 1.

Consequently after time $t_5$, the circuit has returned to the starting or quiescent state that it had just before time $t_0$. Obviously, exactly the same operation would be obtained if the down contact-maker were closed.

The timer circuit of FIG. 4, therefore, has three roles:

(1st) Because the clock signal $Q_6$ changes to 1 only at the end of a time $T_1$ separating $t_1$ from $t_0$, detrimental effects of rebounds of the up or down contact-makers, which might occur during the whole of the time $T_1$, are eliminated, this time $T_1$ being determined by a suitable choice of the duration of the signal from the clock 5 to be longer than the maximum duration for a rebound, that is to say, about 10 to 15 milliseconds in general. In short, if there occured at least one rebound between $t_0$ and $t_1$ the gate 25 would be closed during this rebound, thus blocking the rebound from clock 5 and hence all the processes which develop from it;

(2nd) The same as in the first, if the duration of the closing of one of the up or down contact-makers is shorter than the time $T_1$, there would be blocking of the gate 25 as soon as the corresponding contact-maker opened and hence no signal would appear at the terminal CL. The timer circuit of FIG. 4 therefore compels the up or down contactmakers to be closed for a minimum time;

(3rd) If one of the up or down contact-makers is closed between time $t_3$ and time $t_5$, there will be no change in the process described above between time $t_3$ and time $t_5$ because the signal at $Q_6$ remains at the level 1 until $t_5$, since there is no signal for setting to 0 the flipflop 30 at the output from the inverter 24 so long as the signal at V has not changed back to 0; that is to say, so long as flipflop 8 has not changed state, which can occur only at time $t_5$ as explained above. Consequently with the timer circuit of FIG. 4, a minimum interval of time must be observed between the opening of one of the contact-makers and the next closing of one of these two contact-makers.

Figure 7:
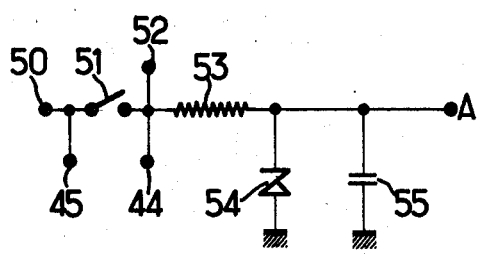
FIG. 7 is a schematic diagram of a detail of the supply circuit for the circuit of FIG. 4.

In FIG. 7 is represented the diagram of the circuit feeding the terminals A, 44 and 45 in the circuits of FIGS. 4 and 5 from the voltage provided by the battery (not shown) of the vehicle. The input terminal 50 to the circuit of FIG. 7 is fed from the battery of the vehicle. This terminal is connected directly to the terminal 45 of the circuit of FIG. 5, which, when driving by day, provides power to amplifier 33 to control the highway lights of the vehicle, and thus the highway lights signals can be made in daylight.

The terminal 50 is likewise connected to the moving contact of switch 51 which is the aforesaid "day-night" switch. This switch 51 is open in the "day" position and closed in the "night" position. The fixed contact of switch 51 is connected, on the one hand, to a terminal 52 to which is connected the normal circuit to the sidelights of the vehicle, and, on the other hand, directly to the terminal 44 of the circuit of FIG. 5, and finally to one end of a resistor 53. The other end of the resistor 53 is connected directly to the terminal A of the circuit of FIG. 4 and to ground via a Zener diode 54 connected in the appropriate sense, and via a capacitor 55 which is in parallel across the Zener diode 54 and acts as its decoupling capacitor. The values of the resistor 53 and the Zener diode 54 are chosen as a function of feed voltage to the logical circuit of FIG. 4.

Figure 8:
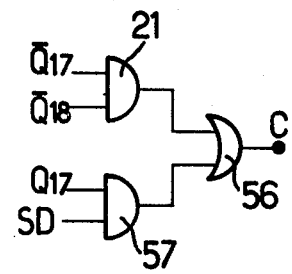

In FIG. 8 is represented the diagram of a logical circuit which, starting from the output signals from the flipflops 17 and 18 in the circuit of FIG. 3, enables passing lights signals to be made when only the sidelights are switched on. Between the gate 21 and the terminal C is interposed an OR gate 56 with two inputs. One of the inputs of OR gate 56 is connected to the output from AND gate 21. The output of OR gate 56 is connected directly to terminal C. The second input to gate 56 is connected to the output from an AND gate 57 with two inputs. To the first input to AND gate 57 is fed the signal $Q_{17}$ from the flipflop 17, while to the second input to this gate 57 is fed the signal SD. The sidelights of the vehicle are switched on when the "day-night" switch 51 is closed and when a transient closing of the down contact has been carried out after closing of the contact-maker 51. At this moment $\overline{Q}_{17} = 0$ and $\overline{Q}_{18} = 1$. Hence, the output from gate 21 is the level 0. At the input to AND gate 57, $Q_{17}$ is 1. Hence, when down contact-maker is closed once more, the state of flipflops 17 and 18 cannot be changed (as already explained above, there is an end-of-"down"-sequence blocking), and there is still the level 0 at the output from the gate 21, but since SD is 1, the level 1 is provided at the output from gate 57, and consequently the level 1 is provided at terminal C which is at the output from OR gate 56. Consequently, thanks to the very simple circuit of FIG. 8, when only the sidelights of the vehicle are switched on, passing light signals can be made by pressing on the down contact-maker.

Figure 9:
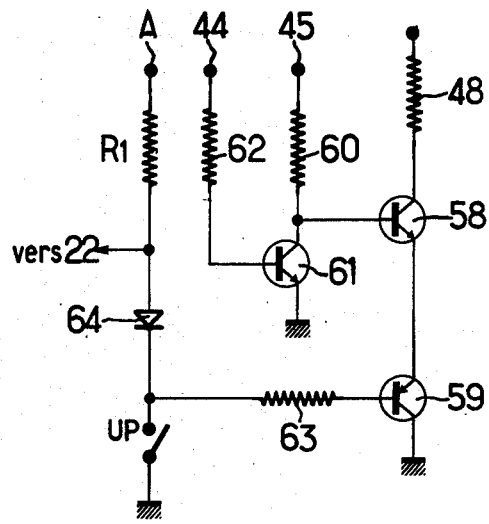
FIG. 9 is a variant upon a portion of the circuit of FIG. 5 enabling, by means of only one control contact, switching of the sequences and highway light signals when driving by day.

The circuit of FIG. 9 enables the contact-maker 49 in the circuit of FIG. 5 to be omitted, and, when the contact-maker 51 of FIG. 6 is open, that is to say in the "day" position, highway lights signals to be made. Between resistor 48 and ground, instead of the contact-maker 49, the emitter-collector circuits of two transistors 58 and 59 are connected in series. The collector of NPN transistor 58 is connected directly to the end of resistor 48 to which previously the contact-maker 49 was connected. The emitter of transistor 58 is directly connected to the emitter of PNP transistor 59, the collector of which is connected directly to ground. The base of transistor 58 is connected, on the one hand, via a resistor 60 to terminal 45 and, on the other hand, to the collector of a NPN transistor 61, the emitter of which is connected directly to ground. The base of transistor 61 is connected via a resistor 62 to terminal 44.

The base of transistor 59 is connected via a resistor 63 to the fixed contact of up switch, the moving contact of which is still connected to ground. On the other hand, between the fixed contact of up switch and the common point of the resistor $R_1$ and the input to inverter 22, a diode 64 is interposed, the cathode of which is turned towards the up contact-maker. The other elements of the circuit of FIG. 4 remain unchanged.

The circuit of FIG. 9 operates as follows: In the "day" position of the contact-maker 51, that is to say when it is open, the terminal 44 is not fed with voltage, and transistor 61 is cut off. On the other hand, terminal 45 is fed with voltage, and the base of transistor 58 is brought to saturation potential, rendering transistor 58 conductive. As long as the up contact-maker remains open, the base of transistor 59 is at the level 1 and this transistor 59 is blocked. Because contact-maker 51 is open, any manipulation of up contact-maker will have no effect on the logical circuit of FIG. 4 because the latter is not being supplied with voltage. As soon as the up switch is closed, the base of transistor 59 is brought to ground, rendering this transistor conductive. Amplifier 33 of FIG. 5 is fed with voltage from terminal 45 and hence can operate when the switch 51 is open. As soon as the two transistors 58 and 59 are conductive, the base of transistor 37 is brought to ground, rendering this transistor conductive and hence, causing switching-on of the highway lights of the vehicle, which are controlled by the coil 47 of the relay for switching these lights.

When the switch 51 is closed, terminal 44 is fed with voltage, which renders conductive transistor 61 and blocks transistor 58. Consequently, transistor 37 is then able to be controlled only from the logical circuit terminating in the terminal R. It may be seen, therefore, that the circuit of FIG. 9, when the up switch is closed momentarily, enables highway light signals to be made, the switch 51 being open.

Figure 10:
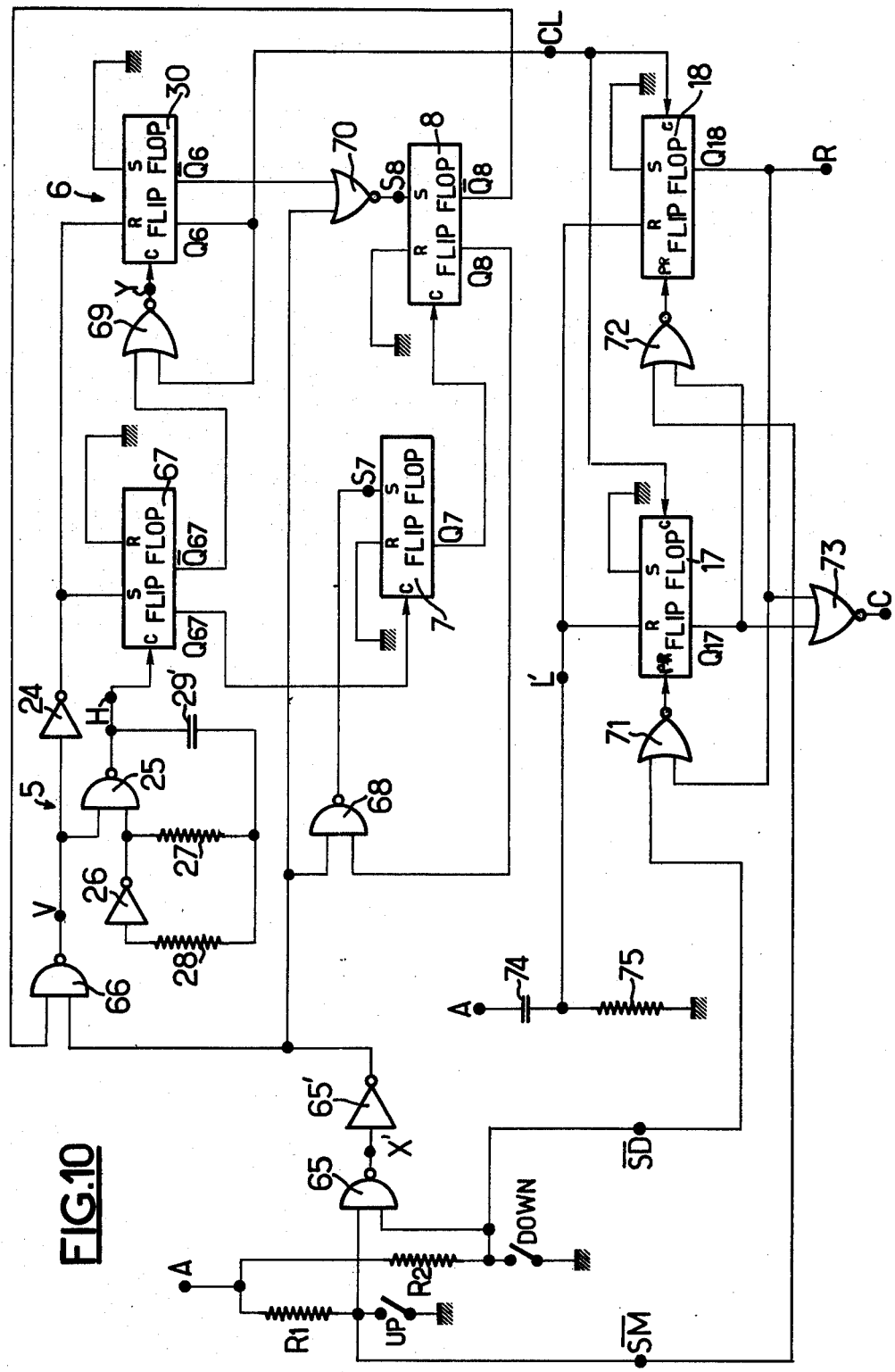
FIG. 10 is a block diagram of a variant upon the circuit of FIG. 4.

FIG. 10 depicts a variant upon the logical circuit of FIG. 4 which is controlled by the up and down contact-makers and completed by a variant upon the circuit of FIG. 3, these two variants employing the same species of integrated circuits. in this FIG. 10, the elements similar to those in the circuits of FIGS. 3 and 4 have been assigned the same reference numbers. The triggered clock 5 is produced in the same way as in the circuit of FIG. 4. It will be observed, however, that capacitor 29 has been replaced by a capacitor 29' of lower value for reasons which will be explained below.

As compared with the circuit of FIG. 4, inverters 22 and 23 have been omitted and OR gate 1 has been replaced by a NAND gate 65 followed by an inverter 65', and OR gate has been replaced by a NAND gate 66. The output H from the triggered clock 5 is no longer connected to an AND gate, but directly to the clock input to a bistable flipflop 67 connected up as a divide by two circuit.

The output from inverter 24 is still connected to the initial state reset input to flipflop 30, but it is likewise connected to the positioning input (set at 1) to flipflop 67, the initial state reset input (set at 0) to which is connected to ground.

OR gate 3 in FIG. 4 has been replaced by a NAND gate 68, the output from which is still connected to the positioning input (set at 1) to flipflop 7 and the first input to which is connected to the output from inverter 65', but the second input to which is connected to the direct output $Q_8$ from flipflop 8.

The clock input to flipflop 7 is no longer excited from the output H from the triggered clock 5, but instead from the direct output $Q_{67}$ from flipflop 67. The reverse output $\overline{Q}_{67}$ from flipflop 67 is connected to a first input to a NOR gate 69, the output from which is connected to the clock signals input Y to flipflop 30. The second input to NOR gate 69 is connected to the output $Q_6$ from flipflop 30 as well as to the terminal CL.

AND gate 4 of FIG. 4 is replaced in the circuit of this FIG. 10 by a NOR gate 70, the output from which is still connected to the positioning input $S_8$ to flipflop 8. One of the inputs of this gate 70 is connected to the reverse output $\overline{Q}_6$ of flipflop 30, while the other input to gate 70 is connected to the output from inverter 65'. Hence, it may be seen that the essential difference in the circuit of FIG. 10 from that of FIG. 4 lies in the fact that the frequency of the signals from the triggered clock 5 is divided by two before feeding them into the one-shot gate 6 and into the flipflop 7. Apart from this difference, the circuit of FIG. 10 operates in the same way as the circuit of FIG. 4, the changing of AND gates into NOR-gates and of OR-gates into NAND-gates bringing about certain modifications to connections which are obvious to those skilled in the art and will not be commented upon below.

On the other hand, in FIG. 10 may be seen an embodiment of the circuit of FIG. 3 connected to the terminals SM,SD,CL. It will, however, be observed that in FIG. 10 the signals to the terminals $\overline{SM}$ and $\overline{SD}$ are the reverse of the signals to the terminals SM,SD of FIG. 3. This embodiment employs the same species of elements as the remainder of the circuit of FIG. 10.

AND gates 19, 20 and 21 of FIG. 3 are replaced by NOR gates 71, 72 and 73 in FIG. 10, and these NOR gates are connected in the same way as the AND gates 19, 20 and 21. Furthermore, flipflops 17 and 18 are connected in the same way as in FIG. 3. The initial state reset inputs (zero reset) to flipflops 17 and 18 are connected to a terminal L' which in turn is connected to the midpoint of a series circuit formed by a capacitor 74 and a resistor 75. The second electrode of capacitor 74 is connected to terminal A, while the second side of resistor 75 is connected to ground. This zero-set or prepositioning circuit is in itself known and its operation will not be explained below.

Figure 11:
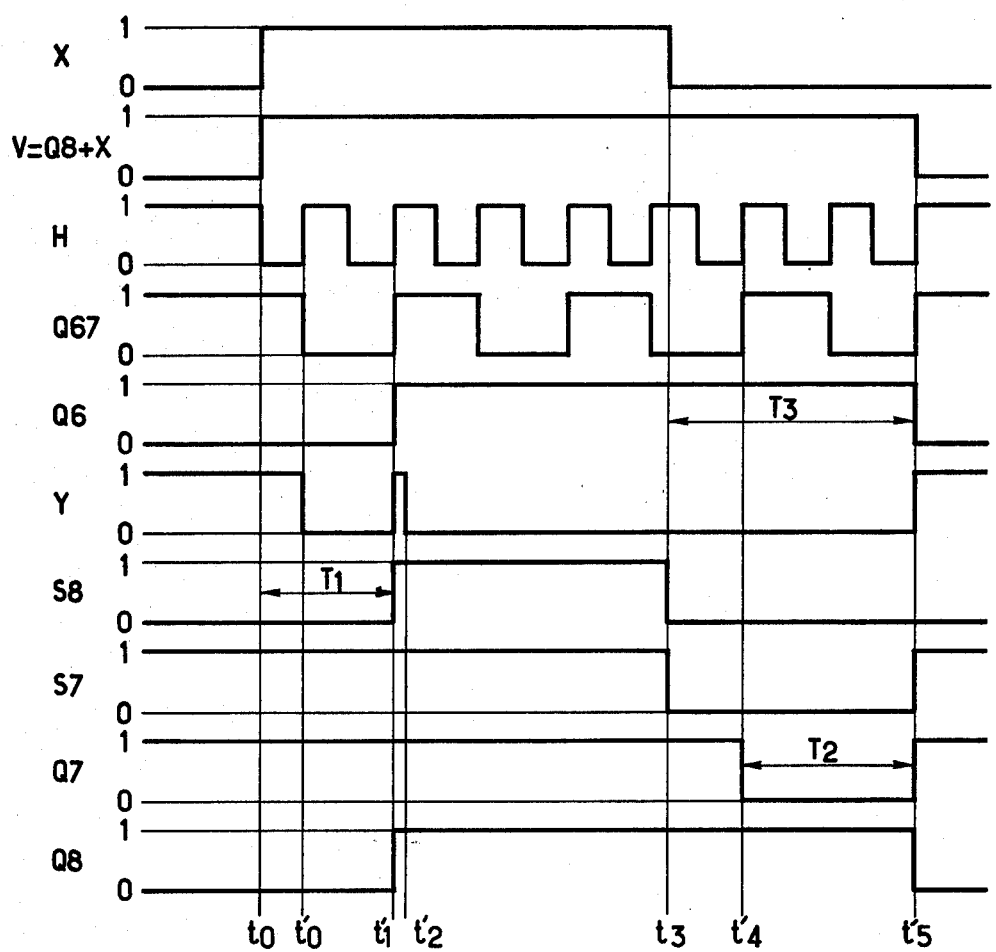
FIG. 11 is a graph, as a function of time, of some signals appearing in the circuit of FIG. 10.

The graph of FIG. 11 represents the development as a function of time of the main signals in the circuit of FIG. 10. FIG. 11 includes the signals which appear at the corresponding points in the graph of FIG. 6, and, in addition, includes the signal $Q_{67}$, the direct output from flipflop 67.

The time at which one of the up or down contacts closes is still designated by $t_0$, and before this time $t_0$ the logical levels are the same as for FIG. 6. In addition, the flipflop 67 being set to 1 by the level 1 at the output from inverter 24, its output $Q_{67}$ is at the level 1. Because flipflop 67 is interposed between the output H from triggered clock 5 and the clock signals input Y to flipflop 30, the first leading edge of the signal at H which occurs at time $t'_0$ makes the flipflop 67 toggle (there is no longer any signal 1 at its positioning input). Hence, at time $t'_0$ the signal Y changes to 0, and it changes back to 1 only at the second leading edge of the signal at H, at time $t'_1$.

Similarly, after the opening at time $t_3$ of the contact-maker which had closed at time $t_0$, at the first leading edge of the signal at the output $Q_{67}$ from flipflop 67, that is to say, at the instant $t'_4$, flipflop 7 changes state, and its output $Q_7$ changes to 0. Output $Q_7$ changes back to 1 only at time $t'_5$ at which the leading edge of the signal appears at $Q_{67}$, that is to say, the second leading edge of the signal at H after time $t'_4$.

Consequently, thanks to the flipflop 67 operating as a divider by 2 of the frequency of the triggered clock 5, the recurrence frequency of the clock may be doubled with respect to that which it had in the circuit of FIG. 4, the other conditions remaining the same (especially the duration of the closing of the up or down contact). Hence, the value of capacitor 29 may be reduced in the same proportion, and it becomes the capacitor 29'.

In one embodiment of the circuit of FIG. 10, there were employed a capacitor 29' of 22nf, a resistor 27 of 180kΩ, and a resistor 28 of 2.2MΩ to obtain a delay $T_1$ of about 15 ms for a frequency of the signal at the point H of 100 Hz; that is to say, a period of the clock signal of 10 ms, the timelapse $T_2$ lying between $t'_4$ and $t'_5$ being about 20 ms, the time $T_3$, i.e., the delay between the trailing edge of the signal appearing at the output CL from the timer circuit and the trailing edge of the signal from the up or down switch, being of the order of 20 to 30 ms.

Obviously, instead of the circuit lying between the terminal X' and the terminal CL, one might quite simply put a known device producng a delay $T_1$ and a delay $T_3$ (lying between $t_3$ and $t'_5$), both adjustable, such, for example, as a circuit with monostable multivibrators, but the delay in such a circuit would be more difficult to adjust than that obtained with the circuit of the present invention.

Figure 12:
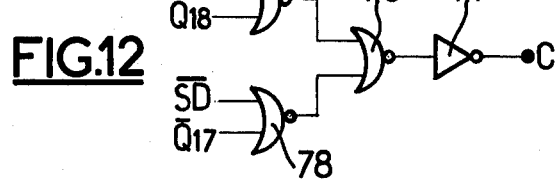

In order to be able with the circuit of FIG. 10 to make passing lights signals when only the sidelights are switched on, recourse is had to the circuit of FIG. 12. Into the circuit of FIG. 10 is interposed between the output from the gate 73 and the terminal C another NOR gate 76, with two inputs, and an inverter 77. The output from gate 76 is connected to the input to inverter 77, and the output from inverter 77 is connected to terminal C. The first input to NOR gate 76 is directly connected to the output from NOR gate 73, while the second input to gate 76 is connected to the output from another NOR gate 78 with two inputs. The first input to gate 78 is connected directly to the terminal $\overline{SD}$, while the second input to gate 78 is connected to the output $\overline{Q}_{17}$ from flipflop 17.

In the same way as in the case of the circuit of FIG. 8, it is easily demonstrated that when the sidelights of the vehicle are switched on, $Q_{17}$ is 1 and $Q_{18}$ is 0; hence, the output from the gate 73 is 0. On the other hand, $\overline{SD}$ is 1 and $\overline{Q}_{17}$ is 0; that is to say, the output from the gate 78 is likewise 0. Consequently, the output from gate 76 is the level 1, and the level 0 is provided at the output from inverter 77.

With only the sidelights switched on, if the down contact-maker is closed momentarily, it produces a level 0, hence the output from gate 78 changes to 1, and the output from gate 76 then changes to 0, and so the output of inverter 77 at terminal C is 1, and the passing lights are switched on during the whole time that the down contact-maker is closed.

The circuit of the present invention therefore enables by simple touching of a switch having two transient positions, control of the switching-on and the extinction of the highway lights and passing lights of the automobile in a sure quick way, as well as highway light signals or passing light signals by means of the same contact-maker.

The sequential system for control with two transient inputs may just as well be used for control of headlights as for any other sequential control (indication of data, for example, on an instrument board) the number of data not being restricted.

It will be observed that all the bistable flipflops described above can change state only when they receive a rising front at their clock signal input, but one might provide flipflops which change state at a falling front by modifying the circuits in an appropriate fashion obvious to those skilled in the art.

What is claimed is:

1. A sequential control circuit capable of sequencing through a number of stable states in a predetermined order, starting from a predetermined stable state and sequencing in either of two opposite directions, said circuit comprising a contact maker normally assuming a first position and capable alternatively of assuming either of two transient positions of contact, said contact maker when in one of the transient positions generating a transient signal indicative of the particular transient position assumed; timing means coupled to said contact maker for providing a timer signal in response to generation of a transient signal by said contact maker; and a logic circuit coupled to said contact maker and to said timing means and capable of sequencing through a number of output conditions corresponding with the stable states, said logic circuit, during presence of the timer signal, being responsive to a transient signal to sequence to another output condition, the direction of sequencing of said logic circuit being dependent upon the transient position assumed by said contact maker, said logic circuit including means responsive to initial application of voltage to said logic circuit for setting said logic circuit to a predetermined one of the output conditions.

2. A sequential control circuit as claimed in claim 1 in which said timing means provides a timer signal that is a rectangular signal having a leading edge and a trailing edge which are delayed with respect to, respectively, the initiation and the termination of the transient signal.

3. A sequential control circuit as claimed in claim 2 in which the timer signal leading edge is delayed in the order of about fifteen milliseconds with respect to the initiation of the transient signal.

4. A sequential control circuit as claimed in claim 1 in which said timing means includes a clock responsive to presence of a transient signal for generating clock signals; a gate circuit coupled to said clock and capable of alternatively assuming either of two gate circuit conditions, said gate circuit assuming one of the two gate circuit conditions in the absence of a transient signal, said gate circuit in the presence of a transient signal assuming the other of the two gate circuit conditions in response to a clock signal applied thereto; a first frequency divider circuit coupled to said clock to provide a control signal at a frequency one-half the frequency of clock signals applied thereto; a switching circuit coupled to said first frequency divider and to said gate circuit, said switching circuit capable of alternatively assuming either of two switching circuit conditions, said switching circuit assuming one of the switching circuit conditions in response to the simultaneous occurrence of a transient signal and the gate circuit being in the second gate circuit condition, said switching circuit alternating between the two switching circuit conditions in response to control signals from said first frequency divider and either the absence of the transient signal or the present of the gate circuit first gate condition; said clock being further responsive to said one of the two switching circuit conditions for generating clock signals; said first frequency divider circuit being inhibited from generating control signals both during presence of a transient signal and during presence of the other of the two switching circuit conditions; said gate circuit being coupled to said logic circuit to provide the timer signal thereto.

5. A sequential control circuit as claimed in claim 4 in which said timing means further includes a second frequency divider circuit having an input connected to said clock and an output connected to said gate circuit and to said first frequency divider circuit to apply clock signals thereto.

6. A sequential control circuit as claimed in claim 4 in which the clock is an astable multivibrator gated by the transient signal.

7. A sequential control circuit as claimed in claim 4 in which said gate circuit includes a bistable flipflop, said bistable flipflop assuming a reset condition in response to either the absence of the transient signal or the presence of the switching circuit first condition and assuming a set condition in response to a clock signal applied thereto.

8. A sequential control circuit as claimed in claim 1 in which said logic circuit includes reversible counting means for providing a number of outputs equal to the number of output conditions; said reversible counting means sequencing in a first direction to provide a new output in response to simultaneous occurrence of a transient signal indicative of one of the transient positions and the presence of the timer signal; said reversible counting means sequencing in the opposite direction to provide a new output in response to simultaneous occurrence of a transient signal indicative of the other of the transient positions and the presence of the timer signal.

9. A sequential control circuit as claimed in claim 1 in which said logic circuit includes control means responsive to sequencing to the last of the number of output conditions in a direction of sequencing for generating a control signal to prevent further sequencing in that direction.

10. A sequential control circuit as claimed in claim 9 in which said logic circuit includes reversible counting means for providing a number of outputs equal to the number of output conditions; said reversible counting means sequencing in a first direction to provide a new output in response to simultaneous occurrence of a transient signal indicative of one of the transient positions, the presence of the timer signal, and the absence of the control signal; said reversible counting means sequencing in the opposite direction to provide a new output in response to simultaneous occurrence of a transient signal indicative of the other of the transient positions, the presence of the timer signal, and the absence of the control signal.

11. A sequential control circuit as claimed in claim 10 in which said means for setting said logic circuit to a predetermined one of the output conditions includes means for setting said reversible counter to a predetermined one of the number of outputs.

12. A sequential control circuit as claimed in claim 1, adapted for controlling the outside lighting of an automobile, in which said logic circuit includes a two-position switch having a first position for removing voltage from said logic circuit and a second position for applying voltage to said logic circuit.

13. A sequential control circuit as claimed in claim 12 in which said logic circuit output conditions correspond with conditions of the outside lighting of the automobile.

14. A sequential control circuit as claimed in claim 12 in which the predetermined one of the output conditions corresponds to a condition in which one set of outside lights on an automobile is energized.

15. A sequential control circuit as claimed in claim 12 in which said logic circuit includes means for energizing one set of outside lights of the automobile while said two-position switch is in said first position.

16. A sequential control circuit as claimed in claim 12 in which said logic circuit includes means for energizing one set of outside lights of the automobile only when another set of outside lights of the automobile is energized.

17. A sequential control circuit as claimed in claim 12 in which said logic circuit includes first and second bistable flipflops, each capable of assuming first and second stable states, said first bistable flipflop assuming its first stable state in response to a clock signal during presence of a transient signal indicative if one of the transient positions while said second bistable flipflop is in its second stable state, said second bistable flipflop assuming its first stable state in response to a clock signal during presence of a transient signal indicative of the other of the transient positions while said first bistable flipflop is in its second stable state, each of said first and second bistable flipflops assuming its second stable state in response to a clock signal either during absence of its transient signal or while the other bistable flipflop is in its first stable state; and means responsive to the stable states of said bistable flipflops for controlling the outside lighting of the automobile.

18. A sequential control circuit as claimed in claim 17 in which said means responsive to the stable states of said bistable flipflops includes gating means responsive to said first and second bistable flipflops simultaneously being in their second states for controlling the switching of a first set of outside lights of the automobile, and connection means adapted to couple one of said flipflops to a second set of outside lights of the automobile, for controlling the switching thereof when said one of said flipflops is in its first stable state.

19. a sequential control circuit as claimed in claim 18 in which said connection means includes a contact maker switch.

20. A sequential control circuit as claimed in claim 18 in which said first and second bistable flipflops are controlled by negative logic circuitry.

21. A sequential control circuit as claimed in claim 18 in which said connection means includes means for energizing one set of outside lights of the automobile while said two-position switch is in its first position.

22. A sequential control circuit as claimed in claim 18 in which said connection means includes means responsive to simultaneous absence of the transient signal indicative of the other of the transient positions and presence of the other of said flipflops in its first stable state for controlling the switching of the second set of outside lights.

* * * * *